United States Patent
Umamoto

(10) Patent No.: US 9,466,201 B2
(45) Date of Patent: Oct. 11, 2016

(54) ALARM OUTPUT DEVICE AND ALARM OUTPUT METHOD

(75) Inventor: Eiichi Umamoto, Tokyo (JP)

(73) Assignee: Nihon Techno Co., Ltd. (JP)

( * ) Notice: Subject to any disclaimer, the term of this patent is extended or adjusted under 35 U.S.C. 154(b) by 1 day.

(21) Appl. No.: 14/362,090

(22) PCT Filed: May 31, 2012

(86) PCT No.: PCT/JP2012/064160
§ 371 (c)(1),
(2), (4) Date: Jan. 14, 2015

(87) PCT Pub. No.: WO2013/111361
PCT Pub. Date: Aug. 1, 2013

(65) Prior Publication Data
US 2015/0213704 A1    Jul. 30, 2015

(30) Foreign Application Priority Data

Jan. 23, 2012  (JP) ................................ 2012-010877

(51) Int. Cl.
*G08B 21/00* (2006.01)
*G08B 21/18* (2006.01)
(Continued)

(52) U.S. Cl.
CPC ............. *G08B 21/182* (2013.01); *G06Q 10/00* (2013.01); *H02J 3/14* (2013.01); *G01R 22/10* (2013.01); *H02J 2003/143* (2013.01);
(Continued)

(58) Field of Classification Search
CPC ...................................................... Y02E 60/12
USPC ......................... 340/636.1, 870.07; 713/300
See application file for complete search history.

(56) References Cited

U.S. PATENT DOCUMENTS 5,596,278 A * 1/1997 Lin ..................... H01M 10/488
                                                      324/435
5,987,613 A * 11/1999 Busch ................... G06F 1/1616
                                                      713/300

(Continued)

FOREIGN PATENT DOCUMENTS

GB        2449670 A    12/2008
JP      S61-227634 A    10/1986

(Continued)

OTHER PUBLICATIONS

Extended European Search Report for Application No. EP 12866606.2 dated Dec. 17, 2015 (6 pages).

*Primary Examiner* — Benjamin C Lee
*Assistant Examiner* — Israel Daramola
(74) *Attorney, Agent, or Firm* — Harness, Dickey & Pierce, P.L.C.

(57) ABSTRACT

Conventional technology is based on the prerequisite that an appropriate value has been established in advance as a target value for power consumption, but this does not does not take into consideration the possibility of establishment of an excessively low value. In order to solve the aforementioned problem, an alarm output device is provided, characterized by determining at all times whether or not electric power expected to be consumed within a regular interval of time exceed the set upper limit target value and by outputting an alarm in case that the electric power exceeds the set upper limit target value at approximately the point in time at which a predetermined interval of time commences or by outputting instructions for changing the set upper limit target value within such interval.

6 Claims, 18 Drawing Sheets

(51) Int. Cl.
  *G06Q 10/00* (2012.01)
  *H02J 3/14* (2006.01)
  *G01R 22/10* (2006.01)
(52) U.S. Cl.
  CPC ....... *Y02B 70/3225* (2013.01); *Y02B 70/3266* (2013.01); *Y04S 20/222* (2013.01); *Y04S 20/242* (2013.01)

(56) References Cited

U.S. PATENT DOCUMENTS

| | | |
|---|---|---|
| 2009/0153537 A1 | 6/2009 | Tada et al. |
| 2011/0095897 A1 | 4/2011 | Sutrave |
| 2012/0316693 A1 | 12/2012 | Ogawa et al. |

FOREIGN PATENT DOCUMENTS

| | | | |
|---|---|---|---|
| JP | 2005-308729 | A | 11/2005 |
| JP | 2008-216243 | A | 9/2008 |
| JP | 2011-242927 | A | 12/2011 |
| JP | 2013015883 | A * | 1/2013 |
| KR | 10-2009-0033413 | A | 4/2009 |
| KR | 10-2011-0082961 | A | 7/2011 |
| TW | 2011-19173 | A | 6/2011 |
| TW | 2012-03770 | A | 1/2012 |
| WO | WO-2008-025939 | A2 | 3/2008 |
| WO | WO-2011-030200 | A1 | 3/2011 |
| WO | WO-2011-139715 | A2 | 11/2011 |

* cited by examiner

ALARM OUTPUT DEVICE AND ALARM OUTPUT METHOD

CROSS-REFERENCE TO RELATED APPLICATIONS

This application is a U.S. National Stage Application of International Application No. PCT/JP2012/064160 filed on May 31, 2012, and published in Japanese as WO 2013/111361 A1 on Aug. 1, 2013. This application claims priority to Japanese Application No. 2012-010877 filed on Jan. 23, 2012. The disclosures of the above applications are incorporated herein by reference.

FIELD OF THE INVENTION

The present invention relates to an alarm output device and an alarm output method.

BACKGROUND OF THE INVENTION

In general, devices for which a target value for power consumption is established and an alarm is outputted based on such target value in order to suppress power consumption have been known. For example, according to Unexamined Japanese Patent Application Publication No. 2008-216243, an outlet adapter that a value set for peak current in its memory and outputs an alarm when the current is a certain percentage of such value has been disclosed. Additionally, in Unexamined Japanese Patent Application Publication No. 2011-242927, a system for determining energy consumption that outputs an alarm when the power consumption is equal to or greater than a set value has been disclosed.

SUMMARY OF THE INVENTION

Problems to be Solved by the Invention

Conventional technology is based on the prerequisite that an appropriate value has been established in advance as a target value for power consumption, but this does not does not take into consideration the possibility of establishment of an excessively low value. For example, in cases in which the upper limit target value for power consumption is lower than the minimum necessary standby electric power that is expected to be consumed, such target value is not appropriate as a target value. It is not preferable to output an alarm that urges suppression of power consumption based on such an inappropriate value.

Means for Solving the Problems

In order to solve the above deficiencies, the present invention provides an alarm output device comprising an upper limit target value setup unit for establishing an upper limit target value for power consumption for a regular interval of time, a power consumption acquisition unit for obtaining electric power expected to be consumed within such interval of time, a determination unit for determining at all times whether or not the electric power acquired through the power consumption acquisition unit exceed the set upper limit target value, and a first alarm output step for outputting an alarm in case that the electric power exceeds the set upper limit target value determined by the determination unit at approximately the point in time at which a predetermined interval of time commences. Furthermore, in lieu of the aforementioned first alarm output step, an aspect of the invention provides a first change instruction output unit for outputting instructions to the upper limit target value setup unit for changing the set upper limit target value within a predetermined interval during or following which an alarm is outputted, in case that the electric power exceeds the set upper limit target value determined by the determination unit at approximately the point in time at which the interval of time commences.

Moreover, an aspect of the invention provides an alarm output device comprising an upper limit target value setup unit for establishing an upper limit target value for power consumption for a regular interval of time, a power consumption acquisition unit for obtaining electric power expected to be consumed within such interval of time, a standby electric power acquisition unit for obtaining standby electric power expected to be consumed within such interval of time, a determination unit for determining at all times whether or not the electric power acquired through the power consumption acquisition unit exceed the set upper limit target value, and a second alarm output step for outputting an alarm in case that the electric power exceeds the set target value determined by the determination unit, if the upper limit target value for a predetermined interval of time is equal to or less than the amount of standby electric power obtained through the standby electric power acquisition unit. Furthermore, in lieu of the aforementioned second alarm output step, an aspect of the invention provides a second change instruction output unit for outputting instructions to the upper limit target value setup unit for changing the set upper limit target value within a predetermined interval during or following which an alarm is outputted, in case that the electric power exceeds the set upper limit target value determined by the determination unit, if the upper limit target value for the predetermined interval of time is equal to or less than the amount of standby electric power obtained through the standby electric power acquisition unit.

Advantageous Effect of the Invention

According to the present invention having the above configuration, even if an excessively low value has been established as an upper limit target value for power consumption, an alarm that urges a setting change of the upper limit target value can be outputted. Thereby, it is possible for users to understand that the setting change of the upper limit target value is required. Furthermore, when the upper limit target value is configured such that it automatically changes while or after an alarm is outputted, it is also possible for users to save time and effort for changing the setting.

DETAILED DESCRIPTION OF THE INVENTION

Embodiments of the present invention will be described hereinafter. The mutual relationship between embodiments and the aspects of the current disclosure are described as below. A first embodiment will mainly describe the first and fifth aspects of the current disclosure. A second embodiment will mainly describe the second and sixth aspects of the current disclosure. A third embodiment will mainly describe the third and seventh aspects of the current disclosure. A fourth embodiment will mainly describe the fourth and eighth aspects of the current disclosure. The present invention is not limited to the above embodiments and may be embodied in various forms without exceeding the scope thereof.

First Embodiment

Outline

An alarm output device of a first embodiment is characterized by determining at all times whether or not electric power expected to be consumed within a regular interval of time exceed the set upper limit target value and by outputting an alarm in case that the electric power exceeds the set upper limit target value at approximately the point in time at which a predetermined interval of time commences.

Configuration of First Embodiment

Figure 1:
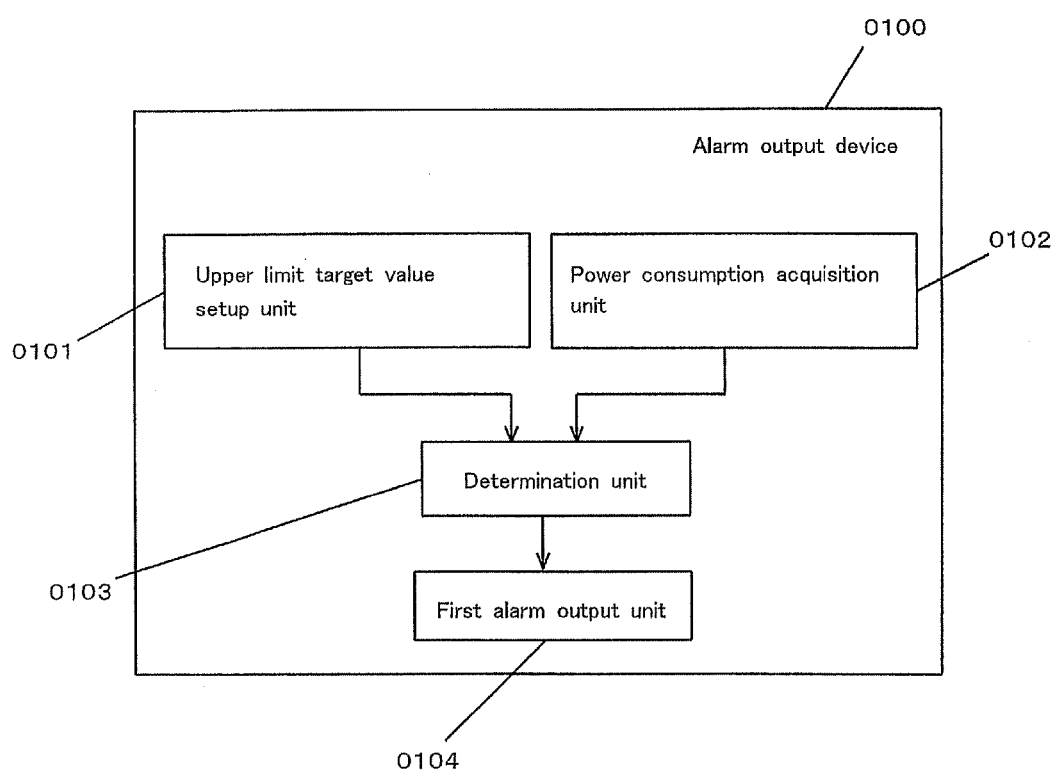
FIG. 1 is a diagram explicating an example of a functional block for an alarm output device of a first embodiment.

FIG. 1 is a diagram explicating an example of a functional block for an alarm output device of a first embodiment. As illustrated in FIG. 1, the "alarm output device" (0100) of the first embodiment comprises an "upper limit target value setup unit" (0101), a "power consumption acquisition unit" (0102), a "determination unit" (0103), and an "alarm output step" (0104).

Note that, the functional block of the devices described below can be implemented by hardware, software, or both hardware and software. Moreover, the present invention can be implemented not only as an apparatus but also as a method thereof. Furthermore, a portion of such inventions may be configured as software. A software product used for causing a computer to execute the software, and the recording medium, in which the software is installed, should be included in the technical scope of the present invention (the same applies throughout the entire specification).

The "upper limit target value setup unit" has a function for establishing an upper limit target value for power consumption for a regular interval of time. The term "regular interval of time" refers to a time interval as a unit of measurement of power consumption identified by the commencement time and the finish time. For example, it is possible to divide 24 hours on an on-the-hour basis and establish 24 separate intervals of time, such as 0:00-1:00, 1:00-2:00, . . . , 23:00-24:00. Moreover, it is also possible to divide 24 hours on a 30-minute basis and establish 48 separate intervals of time, such as 0:00-0:30, 0:30-1:00, . . . 23:30-24:00. Furthermore, it is also possible to use 15-minute intervals or hourly intervals. In addition, the length of each regular interval of time does not have to be the same. It is possible to establish late-night intervals of time that are longer than daytime intervals of time. For example, intervals of time can be established with due attention to the conservation of electricity, and upper limit target values for each interval of time can be finely tuned via the upper limit target value setup unit, thereby allowing the power saving effect to be enhanced. It is preferable that the length of each interval of time be configured to be modifiable by users as necessary.

Figure 2:
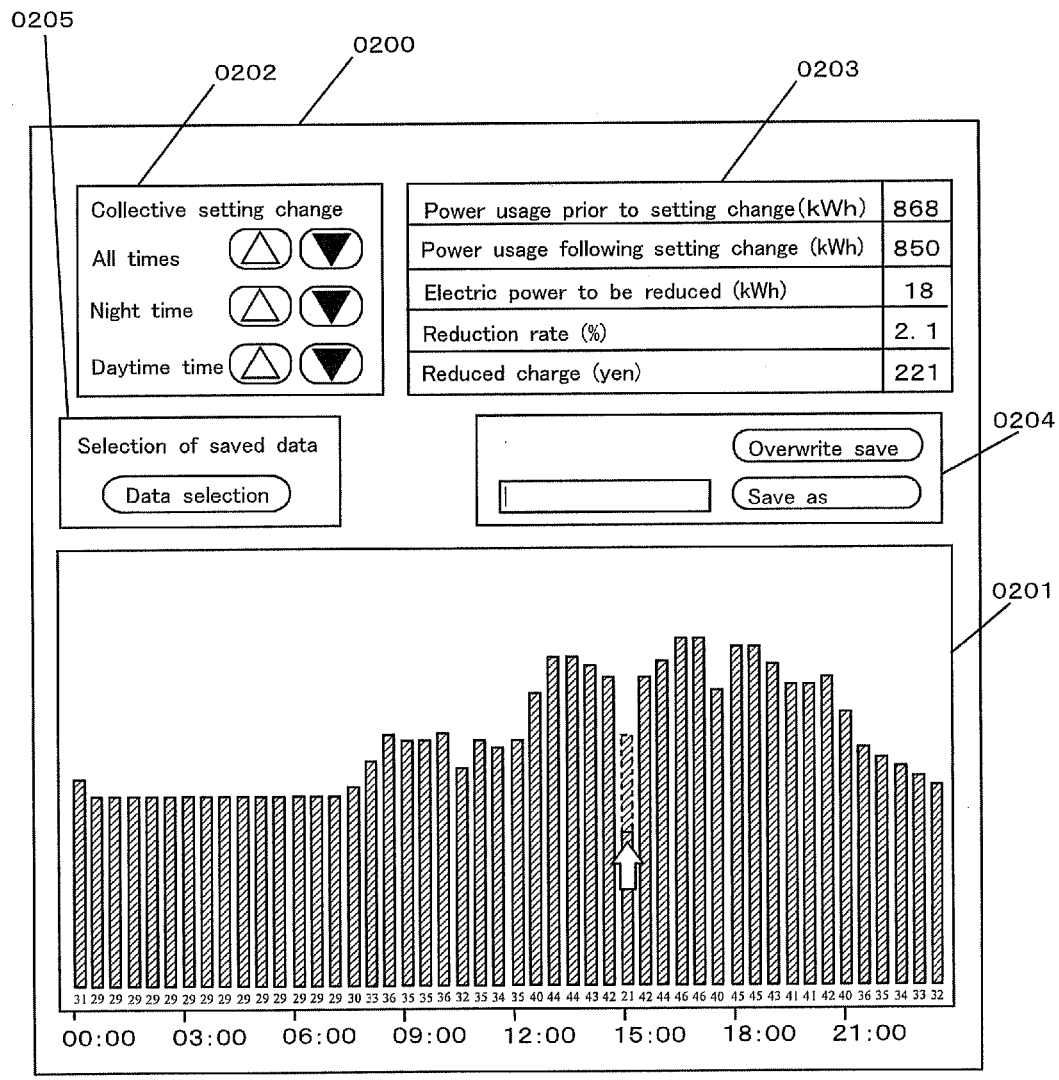
FIG. 2 is a diagram explicating an example of a GUI used for operational setup of an upper limit target value.

It is preferable to establish a GUI for operational setup by users via the upper limit target value setup unit. FIG. 2 is a diagram explicating an example of a GUI used for operational setup of an upper limit target value. FIG. 2 shows an example of configuration whereby 24 hours are divided on a 30-minute basis and 48 separate intervals of time are established, and an upper limit target value is established for each interval of time via a GUI. The bar for the upper limit target value for each interval of time indicated in a "graph display area" (0201) can be freely moved up and down by dragging, thereby allowing easy setup of such upper limit target value. The upper limit target value established for each regular interval of time is indicated underneath the relevant bar. Moreover, clicking the relevant button or buttons indicated in a "setting button display area" (0202) allows movement of the upper limit target value(s) for any or all intervals of time up and down in a uniform manner, allows movement of the upper limit target value(s) for night interval(s) of time (e.g., 11:00 p.m. to 7:00 a.m.) up and down in a uniform manner, and allows movement of the upper limit target value(s) for daytime interval(s) of time (e.g., 7:00 a.m. to 11:00 p.m.) up and down in a uniform manner. As described above, moving upper limit target values for a plurality of intervals of time up and down in a uniform manner allows setup of upper limit target values for short periods of time. However, the possibility exists that inappropriate upper limit target values for specific intervals of time could be established. The alarm output device of the first embodiment makes it possible for users to be aware of such inappropriate upper limit target values. Additionally, daily power usage (kWh) in the case of consumption of electric power equivalent to an upper limit target value before and after setup, electric power to be reduced by changing of the upper limit target value (kWh) and the rate of reduction thereof (%), and the charges (in yen) for daily power usage are indicated in a "setting data display area" (0203). Thereby, it is possible for users to know easily how much electric power can be reduced through setup change, as well as the amount by which the fees can be reduced. Additionally, inputting characters in the input window indicated in a "save button display area" (0204) and clicking the save button allows upper limit target values established for each interval of time to be recorded in recording media. Moreover, clicking the selection button indicated in a "selection button display area" (0205) also allows the upper limit target value data recorded in recording media to be loaded. As explained above, it is assumed that it is possible to use the values established by users as upper limit target values. At the same time, it is also possible for the predetermined multiples of the values established by users (e.g., values that are 1.3 times as great as the values established by users) to be established as upper limit target values.

Figure 3:
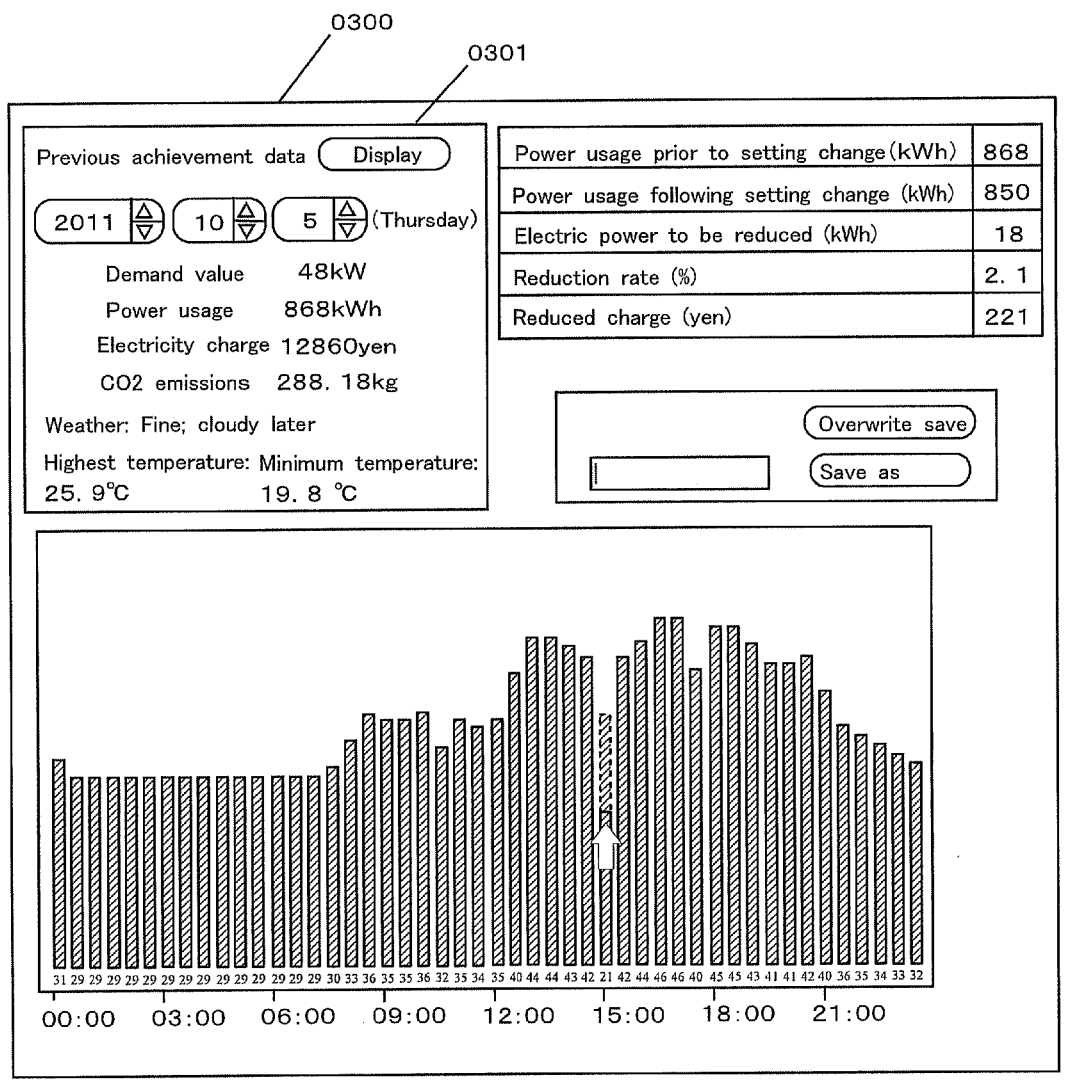
FIG. 3 is a diagram explicating another example of a GUI for operational setup of an upper limit target value.

GUI configurations are not limited to the aforementioned configurations, and various other configurations are possible. FIG. 3 is a diagram explicating another example of a GUI for operational setup of an upper limit target value. FIG. 3 shows an example whereby, a "previous achievement data selection area" (0302) that makes it possible to select desired previous achievement data to be indicated in a "graph display area" (0301) is established. In the "previous achievement data selection area" (0302), it is possible to select dates for previous achievement data that are desired to be indicated. The demand value (i.e., the maximum value for average power used in 30 minutes), daily power usage, daily electricity charges, $CO_2$ emissions (i.e., amount of carbon dioxide discharged upon generation at power plants of electricity for power consumption), weather, maximum temperature, and minimum temperature for a selected date can be displayed therein. Information related to weather, temperature, and the like, can be received from predetermined servers via a network, and such information that has been matched with dates for achievement data can be recorded. Additionally, in case that it is possible to obtain information related to weather, temperature, and the like, for certain time frames, such information that has been matched with dates and intervals of time for achievement data can be recorded. Users select the achievement data to be displayed in accordance with relevant weather and temperatures. When it has been determined that such achievement data is appropriate as an upper limit target value, users can store such data as an upper limit target value data for a specific date or period via the save button.

In case that users desire to change the upper limit target value for a given interval of time, the upper limit target value setup unit may be also configured to accept setup changes only at approximately the point in time at which a predetermined interval of time commences. When the upper limit target value setup unit is configured to accept setup changes only at approximately the point in time at which a predetermined interval of time commences, it is possible to maintain means that allow an inappropriate upper limit target value to be adjusted to an appropriate value. At the same time, it is possible to prevent change to an upper limit target value in a careless manner and thus reduce saving actions.

Figure 4:
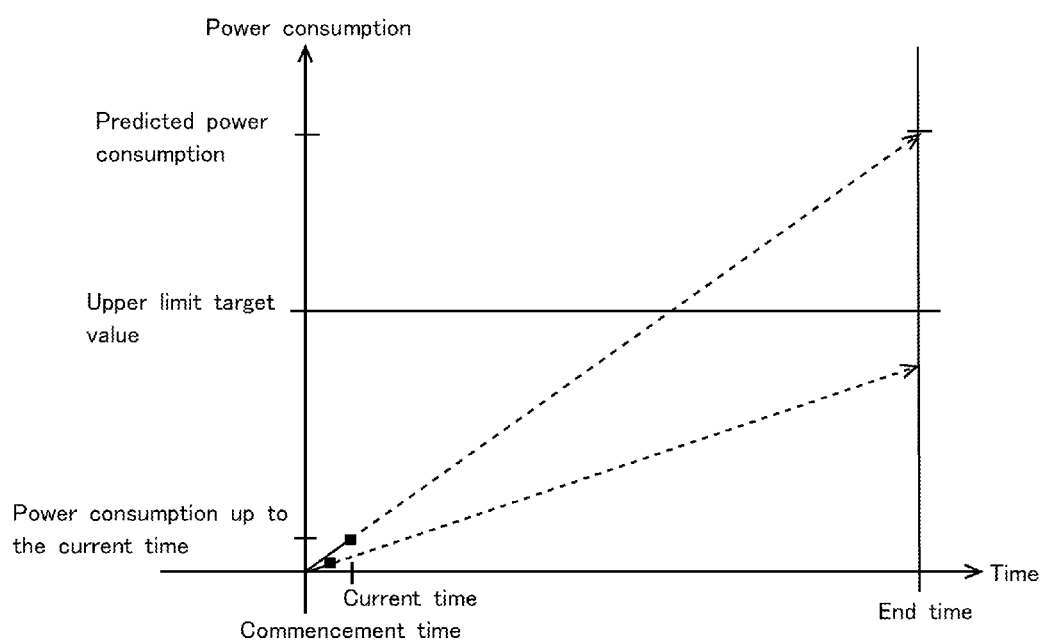
FIG. 4 is a diagram explicating an example of outputted information for setup change on a display.

The "power consumption acquisition unit" has a function for obtaining electric power expected to be consumed within a relevant interval of time. The power consumption acquisition unit may execute processing for computing electric power expected to be consumed within a relevant interval of time through receiving measured power consumption data from a measuring instrument. Alternatively, the power consumption acquisition unit may receive data on electric power expected to be consumed within a relevant interval of time that has been computed by another measuring instrument. In relation to the processing for estimation of power consumption, it is possible for electric power data to be received directly from an instrument that measures power consumption or via another instrument. Based on power consumption during the period from the time of commencement of a relevant internal of time until the current time, the power consumption up to the time at which such interval is completed can be computed. Based on power consumption during a period from commencement time until the current time of a relevant internal of time, in relation to the method for computing the power consumption up to the time at which such interval is completed, as illustrated in FIG. 4, it is possible for linear function fitting to take place and for power consumption at the time at which such interval is completed to be computed. A program for execution of the computation described above is stored beforehand in a storage unit, such as a ROM, is loaded into a RAM, and it is executed by a CPU as necessary. The processing for computation of power consumption to be estimated is executed at predetermined intervals of time (e.g., at 15-second intervals, 1-minute intervals, or the like) and prediction data is updated. Additionally, in case that data for electric power expected to be consumed within such interval of time is received via another device, such reception also takes place at predetermined intervals of time. In addition, predetermined intervals of time are not required to be uniform. It is also possible to increase frequency of updating processing and reception processing of prediction data as the time at which such interval is completed is approached.

The "determination unit" has a function for determining at all times whether or not the electric power acquired through the power consumption acquisition unit exceed the set upper limit target value. The term "determining at all times" refers to determination at intervals that are shorter than predetermined intervals of time. For example, when a predetermined interval of time is 30 minutes, determination takes place at 30-second intervals or 1-minute intervals. When a predetermined interval of time is 2 hours, determination takes place at 5-minute intervals. The determination unit loads upper limit target value data for each regular interval of time into a RAM, and compares such data with power consumption predicted by a CPU. In addition to determining whether or not an upper limit target value for an interval of time for which predicted power consumption has been established is exceeded, the determination unit may also obtain the degree of excess as a result of computation. For example, it is possible to identify what multiple of the predicted power consumption value the upper limit target value for a relevant interval of time is, and the difference between the upper limit target value and the predicted power consumption value in percent terms.

The first alarm output step has a function for outputting an alarm in case that the electric power exceeds the set upper limit target value determined by the determination unit at approximately the point in time at which a predetermined interval of time commences. The term "in case that the electric power exceeds the set upper limit target value determined by the determination unit at approximately the point in time at which a predetermined interval of time commences" refers to a case in which the length from the commencement time until the excess is identified is equal to or less than 10% of the length of a relevant interval of time, or the like. More specifically, when the length of a relevant interval of time is 30 minutes, the excess is identified within 3 minutes following the commencement time. As described above, the term "in case that the electric power exceeds the set upper limit target value determined by the determination unit at approximately the point in time at which a predetermined interval of time commences" refers to a situation in which the set upper limit target value was originally unreasonable. Therefore, in such case, there is a great need to output an alarm and notify users to such effect.

Figure 5:
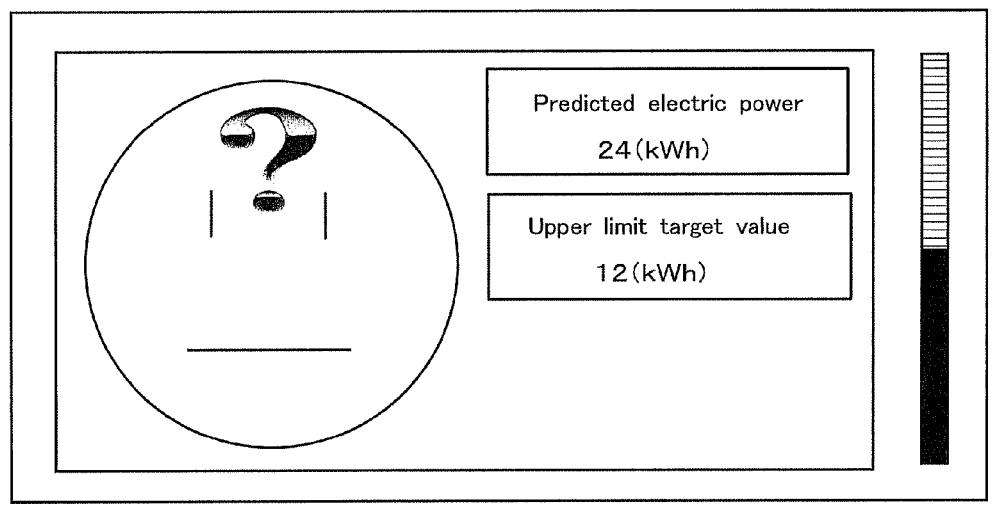
FIG. 5 is a diagram explicating an example of outputted information for suppression of electricity consumption on a display.

In relation to an alarm, a display screen that urges setting change may be outputted on a display, a sound that urges setting change may be outputted to a speaker, or a message that urges setting change may be transmitted to a predetermined terminal (e.g., portable terminal, television apparatus, or the like). FIG. 5 is a diagram explicating an example of outputting a display screen that urges setting change on a display connected to the alarm output device via a wire or wireless communication means. FIG. 5 shows an example in which relevant values are specifically indicated in order to indicate that an upper limit target value for a relevant interval of time is inappropriate for the predicted power consumption. Moreover, an inappropriate upper limit target value is indicated by the characteristics of a character face shown on a display. Users can be aware that the upper limit target value established for a relevant interval of time is inappropriate by looking at the corresponding display screen, and users can change such upper limit target value by using a function of the upper limit target value setup unit. Moreover, in addition to the example mentioned above, it is also possible for characters that urge setting change for an upper limit target value to be shown on a display.

In addition, as described above, the first alarm output step is configured to output an alarm in case that the electric power exceeds the set upper limit target value determined by the determination unit at approximately the point in time at which a predetermined interval of time commences. At the same time, the first alarm output step can be also configured to output an alarm in case that the electric power is equal to or greater than a certain level determined by the determination unit at approximately the point in time at which a predetermined interval of time commences. For example, it is possible to assume that an alarm is outputted in case that the predicted power consumption is equal to or greater than 1.5 times the set upper limit target value and the length from the commencement time until the excess is identified is equal to or greater than 10% of the length of a relevant interval of time. The threshold data as described above is stored in a recording medium of the alarm output device. In addition, such threshold data may be configured so that it can be changed via an operation input means of the alarm output device.

Even if an inappropriate upper limit target value has been established for a relevant interval of time, users can recognize that the inappropriate upper limit target value has been established via an alarm of the alarm output device, and users can reestablish an appropriate upper limit target value for such interval of time using the predicted electric power information.

Specific Configuration of First Embodiment

Figure 6:
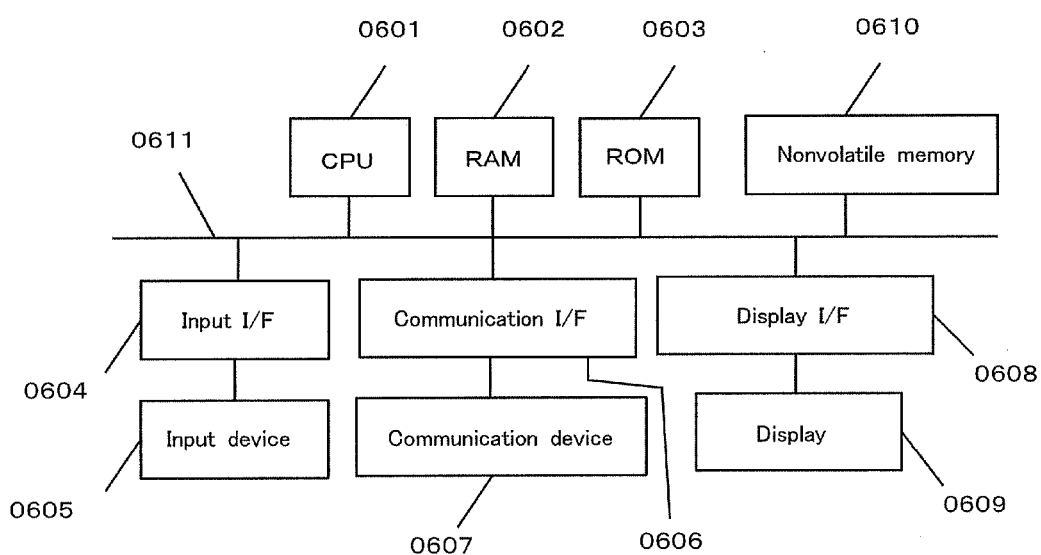
FIG. 6 is a diagram showing an example of a specific hardware configuration of the alarm output device.

FIG. 6 is a diagram showing an example of a specific hardware configuration concerning functional constituent features of the alarm output device. As illustrated in FIG. 6, the alarm output device comprises a "CPU" (0601), a "RAM" (0602), a "ROM" (0603), an "input I/F" (0604), an "input device" (0605), a "communication I/F" (0606), a "communication device" (0607), a "display I/F" (0608), a "display" (0609), and a "nonvolatile memory (e.g., flash memory)" (0610). The aforementioned configuration is mutually connected by a "system bus" (0611) as a data communication path, and transmission, reception, and processing of information take place.

The CPU stores an upper limit target value for power consumption for each regular interval of time inputted from the input device in the nonvolatile memory, and loads such value into the RAM as needed. Data transmitted from a measuring instrument for power consumption is received via the communication device. Based on such data, power consumption from the commencement time until the current time of a relevant interval of time and the predicted value of power consumption until the time at which such interval is completed are computed, and the results of computation are stored in the RAM. Comparing the upper limit target value for power consumption of a relevant interval of time that has been loaded into the RAM with the predicted value of power consumption until the time at which such interval is completed computed above, processing is performed to determine whether or not the predicted power consumption exceeds the upper limit target value. The resultants of such processing are stored in the RAM. The period from the commencement time until the current time within a relevant interval of time is computed and the results of such processing are stored in the RAM. In case it is determined that the predicted electric power to be consumed within the aforementioned interval of time exceeds the upper limit target value, if the period from the commencement time until the current time within a relevant interval of time is equal to or less than 10% the length of such interval of time, alarm data stored in the ROM that urges setting change is loaded into the RAM and an alarm is outputted to the display and the speaker.

Processing Flow of First Embodiment

Figure 7:
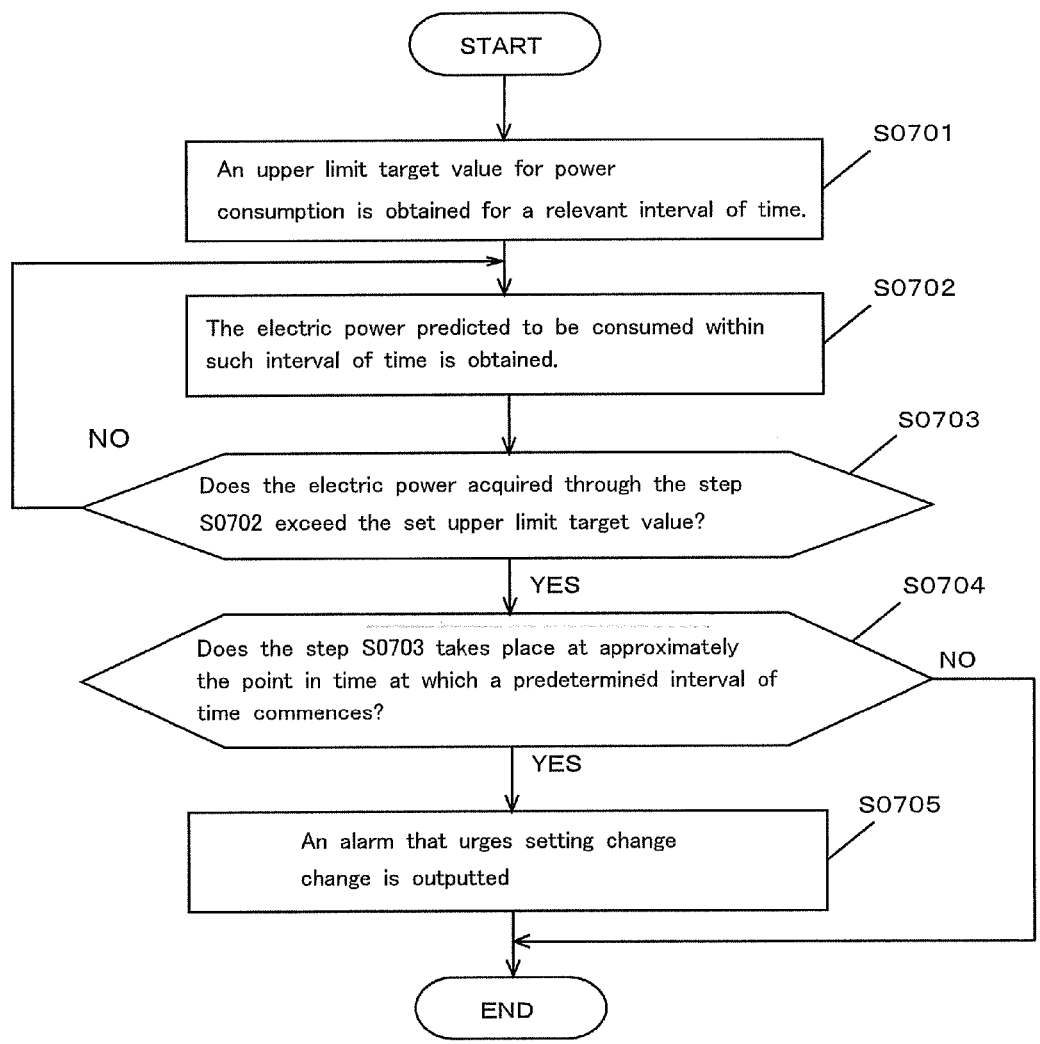
FIG. 7 is a diagram showing an example of the progression of the process of the alarm output method of the first embodiment.

FIG. 7 is a diagram showing an example of the progression of the process of the alarm output method of the first embodiment. The processing flow of FIG. 7 comprises the following steps. Initially, an upper limit target value for power consumption is obtained for a relevant interval of time (upper limit target value step; S0701). Next, the predicted electric power to be consumed within such interval of time is obtained (power consumption acquisition step; S0702). Subsequently, it is determined whether or not the electric power acquired through the power consumption acquisition step exceed the set upper limit target value (determination step; S0703). When it is determined that the electric power exceeds the set upper limit target value, the processing moves on to the step 0704. When it is determined that the electric power does not exceed the set upper limit target value, the processing returns to the step 0702. It is determined whether or not the determination step (S0703) takes place at approximately the point in time at which a predetermined interval of time commences (S0704). When it is determined that the determination step takes place at approximately the point in time at which a predetermined interval of time commences, the processing moves on to the step S0705. When it is determined that the determination step does not take place at approximately the point in time at which a predetermined interval of time commences, the processing is completed. An alarm that urges setting change is outputted (alarm output step; S0705).

Figure 8:
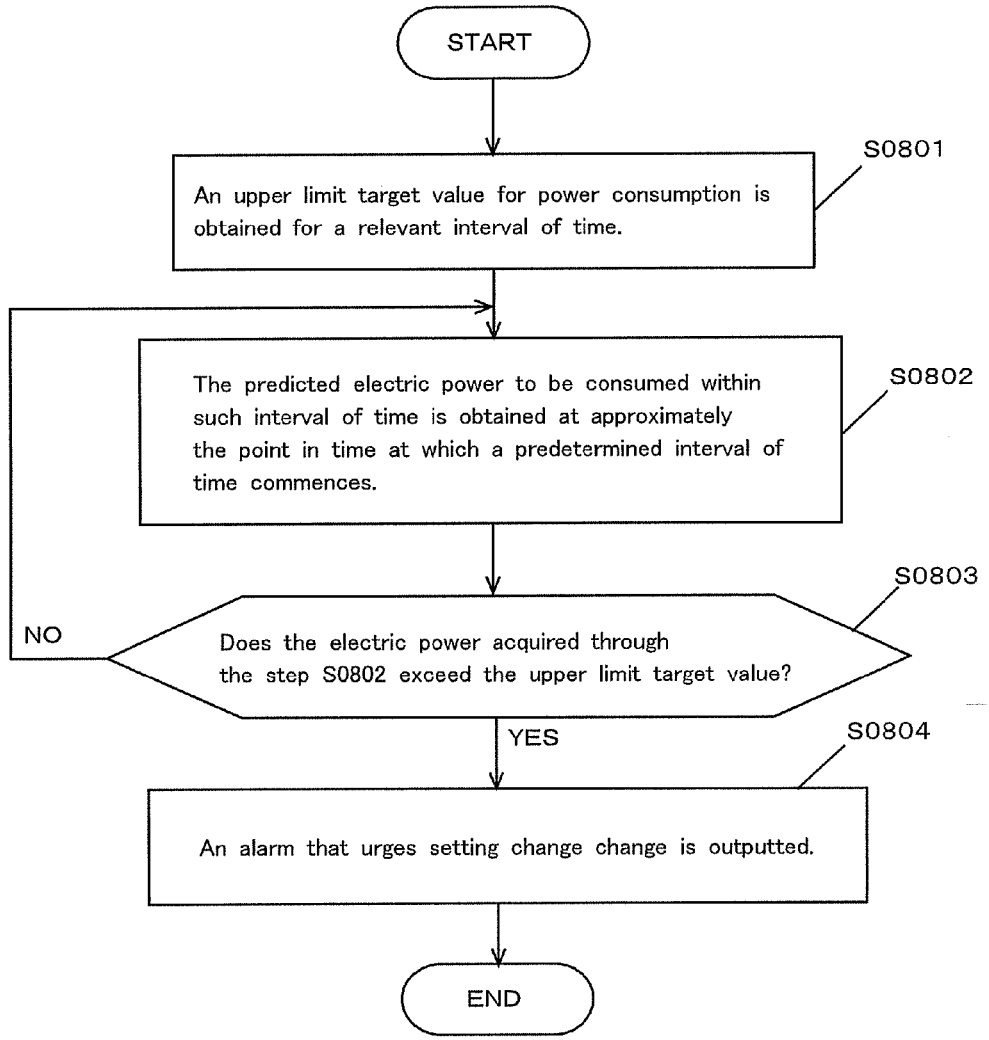
FIG. 8 is a diagram showing another example of the progression of the process of the alarm output method of the first embodiment.

FIG. 8 is a diagram showing another example of the progression of the process of the alarm output method of the first embodiment. The processing flow of FIG. 8 comprises the following steps. Initially, an upper limit target value for power consumption is obtained for a relevant interval of time (upper limit target value step; S0801). Next, the predicted electric power to be consumed within such interval of time is obtained (power consumption acquisition step; S0802). Subsequently, it is determined whether or not the electric power acquired through the power consumption acquisition step exceed the set upper limit target value (determination step; S0803). When it is determined that the electric power exceeds the set upper limit target value, the processing moves on to the step 0804. An alarm that urges setting change is outputted (alarm output step; S0804).

Brief Description of Effects of First Embodiment

According to the alarm output device and the like of the first embodiment, even if an excessively low value has been established as an upper limit target value for power consumption, an alarm that urges setting change of the upper limit target value is outputted, thereby allowing users to understand that setting change of the upper limit target value is necessary.

Second Embodiment

Outline

An alarm output device of a second embodiment is characterized in that it determines at all times whether or not electric power expected to be consumed within a regular interval of time exceed the set upper limit target value and outputs an alarm in case that the electric power exceeds the set target value, if the upper limit target value for a predetermined interval of time is equal to or less than the amount of standby electric power.

Configuration of Second Embodiment

Figure 9:
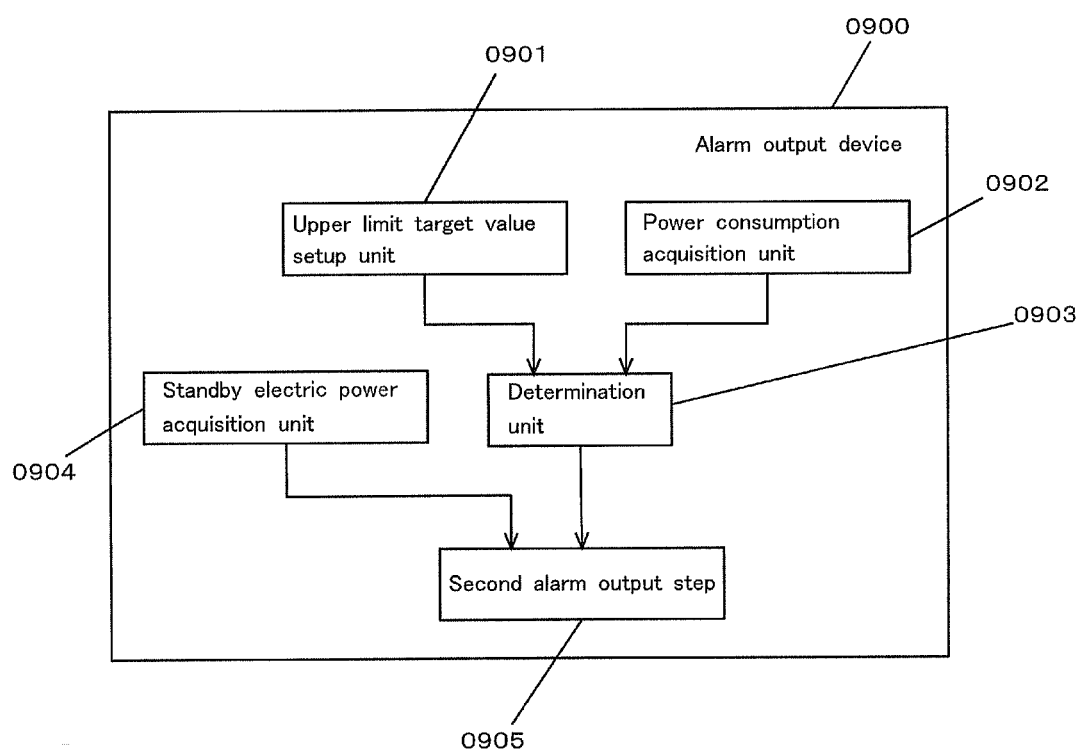
FIG. 9 is a diagram explicating an example of a functional block for an alarm output device of a second embodiment.

FIG. 9 is a diagram explicating an example of a functional block for an alarm output device of a second embodiment. As illustrated in FIG. 9, the "alarm output device" (0900) of the second embodiment comprises an "upper limit target value setup unit" (0901), a "power consumption acquisition unit" (0902), a "standby electric power acquisition unit" (0903), a "determination unit" (0904), and a "second alarm output step" (0905). Explanations of the standby electric power acquisition unit and the second alarm output step, which are not included in the first embodiment, are explained hereinafter.

The "standby electric power acquisition unit" has a function for predicting standby electric power to be consumed within a relevant interval of time. The term "standby electric power" refers to the minimum necessary electric power to be consumed. For instance, there is a substantial need for restaurants to keep refrigerators and freezers operating at all times, and the electric power consumed by such refrigerators and freezers can be said to be their standby electric power. Additionally, there is a high demand for server rooms to keep air conditioners operating in summer such that the temperature in the equipment inside the server apparatuses will not become high. Thus, electric power consumed by such air conditioners in summer can be said to be the standby electric power. As described above, whether or not relevant electric power corresponds to standby electric power differs on a case-by-case basis for stores and workplaces.

The standby electric power acquisition unit can compute standby electric power predicted to be consumed at relevant intervals of time by using electric power consumed at intervals during which persons are not undertaking any actions (e.g., outside business hours). For example, it is possible to consider electric power consumed during the period from 3:00 a.m. to 3:30 a.m. at night and during the period from 12:00 p.m. to 12:30 p.m. while a lunch break is underway to be standby electric power (and this can be the case for any period) for the entire intervals of time at relevant locations and to acquire such standby electric power. It is possible to accept data regarding intervals of time during which persons are not undertaking any actions via an operation input means and a reception means and store such data in recording media in advance. Moreover, in relation to the information on standby electric power consumed during intervals of time during which persons are not undertaking any actions, measured data may be received from a measuring instrument, or results computed via another device may be received in the same manner as in cases in which the power consumption acquisition unit is used. In addition, it is preferable to obtain standby electric power on a regular basis because standby electric power changes in accordance with the seasons.

Figure 10:
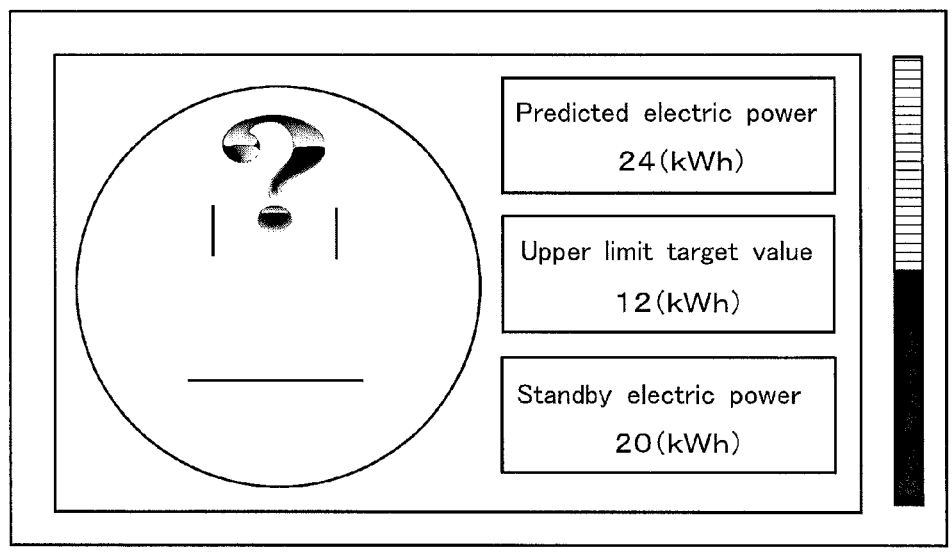
FIG. 10 is a diagram explicating an example of outputted information for setup change on a display.

The "second alarm output step" has a function for outputting an alarm in case that the electric power exceeds the set target value determined by the determination unit, if the upper limit target value for a predetermined interval of time is equal to or less than the amount of standby electric power obtained through the standby electric power acquisition unit. In relation to an alarm, a display screen that urges setting change may be outputted on a display, a sound that urges setting change may be outputted to a speaker, or a message that urges setting change may be transmitted to a predetermined terminal (e.g., portable terminal, television apparatus, or the like). FIG. 10 is a diagram explicating an example of outputting a display screen that urges setting change on a display connected to the alarm output device via a wire or wireless communication means. FIG. 10 shows an example in which, in order to indicate that an upper limit target value for a relevant interval of time is equal to or less than the predicted standby electric power and such upper limit target value is not appropriate for a relevant interval of time, the predicted power consumption, the upper limit target value, and the predicted standby electric power are specifically indicated. Moreover, an inappropriate upper limit target value is indicated by the characteristics of a character face shown on a display. Users can be aware that the upper limit target value established for a relevant interval of time is equal to or less than the predicted standby electric power, and that such value is inappropriate, by looking at the corresponding display screen, and users can change such upper limit target value by using a function of the upper limit target value setup unit. Moreover, in addition to the example mentioned above, it is also possible for characters that urge setting change for an upper limit target value to be shown on a display.

Specific Configuration of Second Embodiment

The specific configuration of the alarm output device of the second embodiment is the same as that of the alarm output device of the first embodiment explained in FIG. 6.

The CPU stores an upper limit target value for power consumption for each regular interval of time inputted from the input device in the nonvolatile memory, and loads such value into the RAM as needed. Data transmitted from a measuring instrument for power consumption is received via the communication device. Based on such data, power consumption from the commencement time until the current time of a relevant interval of time and the predicted value of power consumption until the time at which such interval is completed are computed, and the results of computation are stored in the RAM. Predicted standby electric power values at relevant intervals of time inputted from the input device are stored in nonvolatile memory, and such values are loaded into a RAM as needed. Comparing the upper limit target value for power consumption of a relevant interval of time that has been loaded into the RAM with the predicted value of power consumption until the time at which such interval is completed computed above, processing is performed to determine whether or not the predicted power consumption exceeds the upper limit target value. The resultants of such processing are stored in the RAM. The processing for determining whether or not an upper limit target value for a relevant interval of time exceeds the predicted standby electric power for such intervals of time takes place, and the results of processing are stored in a RAM. In case it is determined that the predicted electric power to be consumed within the aforementioned interval of time exceeds the upper limit target value, if the upper limit target value for such interval of time is equal to or less than the predicted standby electric power, alarm data stored in the ROM that urges setting change is loaded into the RAM and an alarm is outputted to the display and the speaker.

Processing Flow of Second Embodiment

Figure 11:
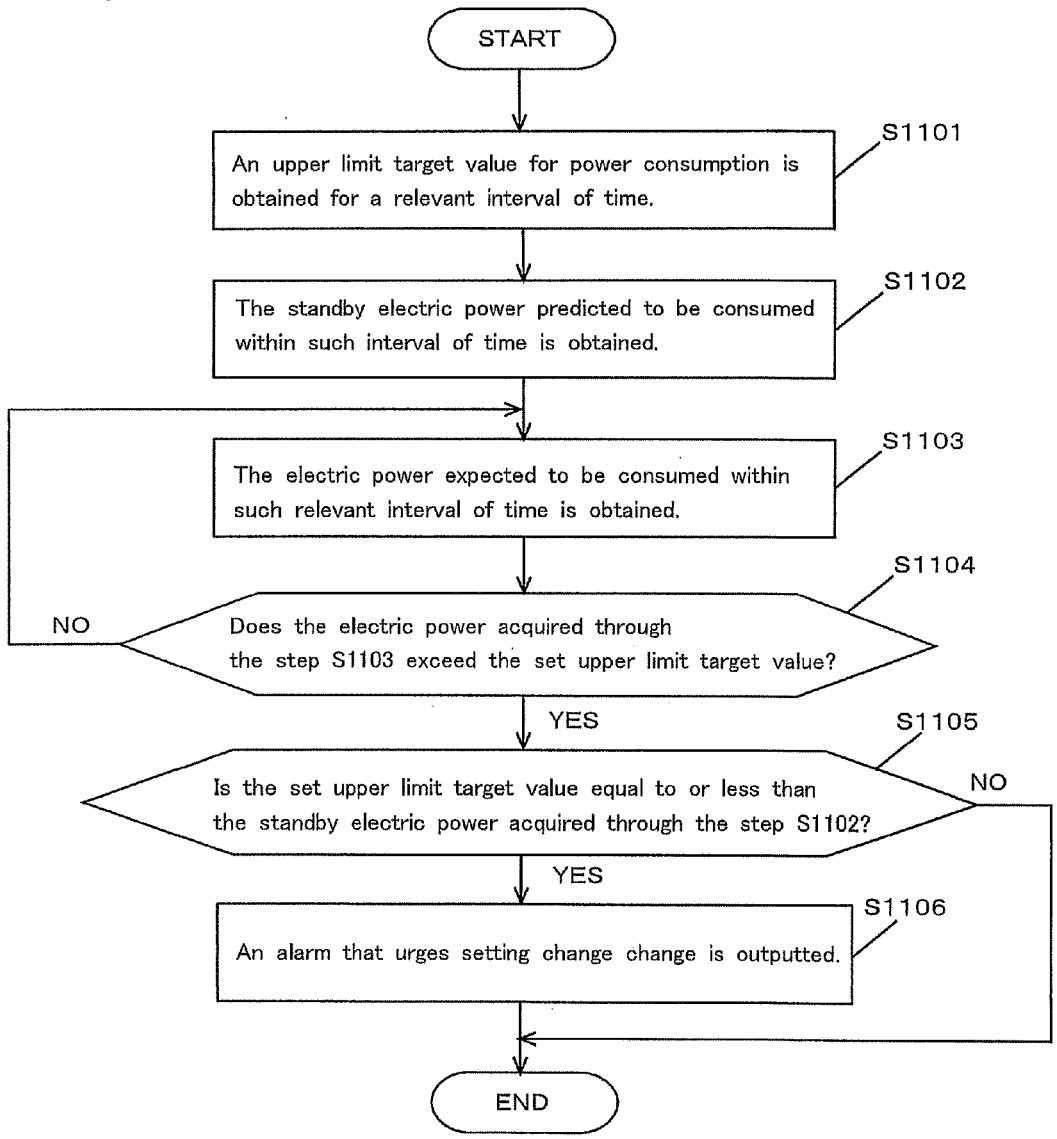
FIG. 11 is a diagram showing an example of the progression of the process of the alarm output method of the second embodiment.

FIG. 11 is a diagram showing an example of the progression of the process of the alarm output method of the second embodiment. The processing flow of FIG. 11 comprises the following steps. Initially, an upper limit target value for power consumption is obtained for a relevant interval of time (upper limit target value step; S1101). Next, the predicted standby electric power to be consumed within such interval of time is obtained (standby electric power acquisition step; S1102). Subsequently, the electric power expected to be consumed within a relevant interval of time is obtained (power consumption acquisition step; S1103). Thereafter, it is determined whether or not the electric power acquired through the power consumption acquisition step exceed the set upper limit target value (determination step; S1104). When it is determined that the electric power exceeds the set upper limit target value, the processing moves on to the step 1105. When it is determined that the electric power does not exceed the set upper limit target value, the processing returns to the step 1103. Whether or not an upper limit target value for a relevant interval of time is equal to or less than the standby electric power obtained through the standby electric power acquisition step is determined (determination step; S1105). In case that it is determined that such upper limit target value for such relevant interval of time is equal to or less than the standby electric power, the processing moves on to the step 1105. In case that it is determined that such an upper limit target value for a relevant interval of time is not equal to or less than the standby electric power, the processing is completed. An alarm that urges setting change is outputted (alarm output step; S1105).

Brief Description of Effects of Second Embodiment

According to the alarm output device and the like of the second embodiment, even if an excessively low value has been established as an upper limit target value for power consumption, an alarm that urges setting change of the upper limit target value is outputted, thereby allowing users to understand that setting change of the upper limit target value is necessary.

Third Embodiment

Outline

An alarm output device of a third embodiment is characterized in that it determines at all times whether or not electric power expected to be consumed within a predetermined interval of time exceed the set upper limit target value and outputs instructions for changing the set upper limit target value within such interval during or following which an alarm is outputted, in case that the electric power exceeds the set upper limit target value determined at approximately the point in time at which the interval of time commences.

Configuration of Third Embodiment

Figure 12:
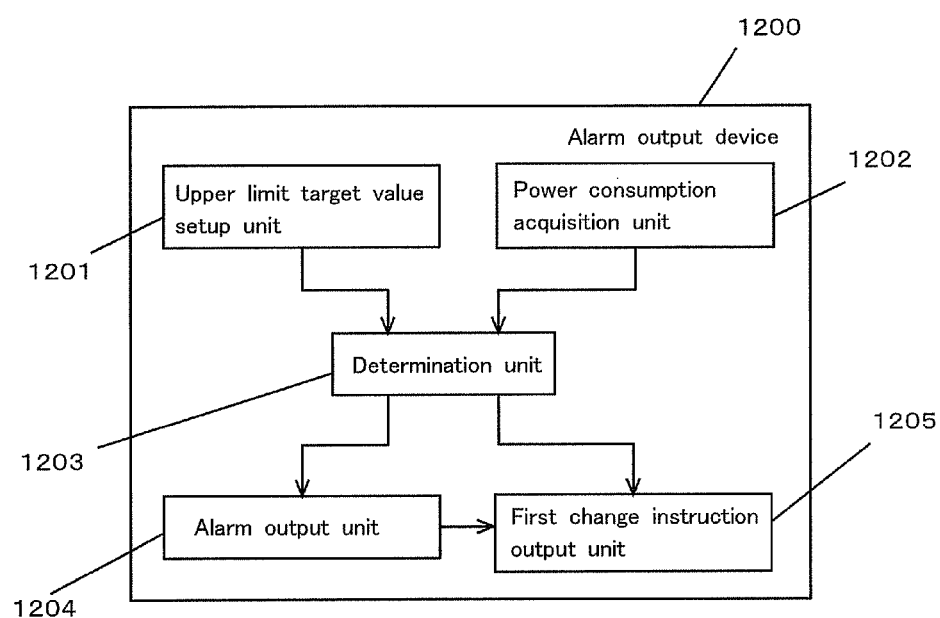
FIG. 12 is a diagram explicating an example of a functional block for an alarm output device of a third embodiment.

FIG. 12 is a diagram explicating an example of a functional block for an alarm output device of a third embodiment. As illustrated in FIG. 12, the "alarm output device" (1200) of the third embodiment comprises an "upper limit target value setup unit" (1201), a "power consumption acquisition unit" (1202), a "determination unit" (1203), an "alarm output unit" (1204), and a "first change instruction output unit" (1205). Explanations of the alarm output unit and the first change instruction output unit, which are not included in the first and second embodiments, are explained hereinafter.

The "alarm output unit" has a function for outputting an alarm in case that the electric power exceeds the set upper limit target value determined by the determination unit. An alarm to be outputted that urges suppression of electricity consumption can be used. However, in case that it is determined that the electric power exceeds the set upper limit target value at approximately the point in time at which the interval of time commences via the first change instruction output unit described below, the nature of the alarm to be outputted may be changed, and an alarm to the effect that an upper limit target value has been automatically changed may be outputted. An alarm can be outputted to a display or speaker, or a relevant message can be transmitted to predetermined terminals (e.g., portable terminal, television apparatus, or the like).

The "first change instruction output unit" has a function for outputting instructions to the upper limit target value setup unit for changing the set upper limit target value within a predetermined interval during or following which an alarm is outputted, in case that the electric power exceeds the set upper limit target value determined by the determination unit at approximately the point in time at which the interval of time commences. The expression "in case that the electric power exceeds the set upper limit target value determined by the determination unit at approximately the point in time at which the interval of time commences" refers to a case in which, compared with the length of a relevant interval of time, the length from the commencement time until the excess is identified is relatively short. As a basis for determination regarding the expression "at approximately the point in time at which the interval of time commences," values for the length from the commencement time until the excess is identified and the length of an interval of time are stored in recording media.

Figure 13:
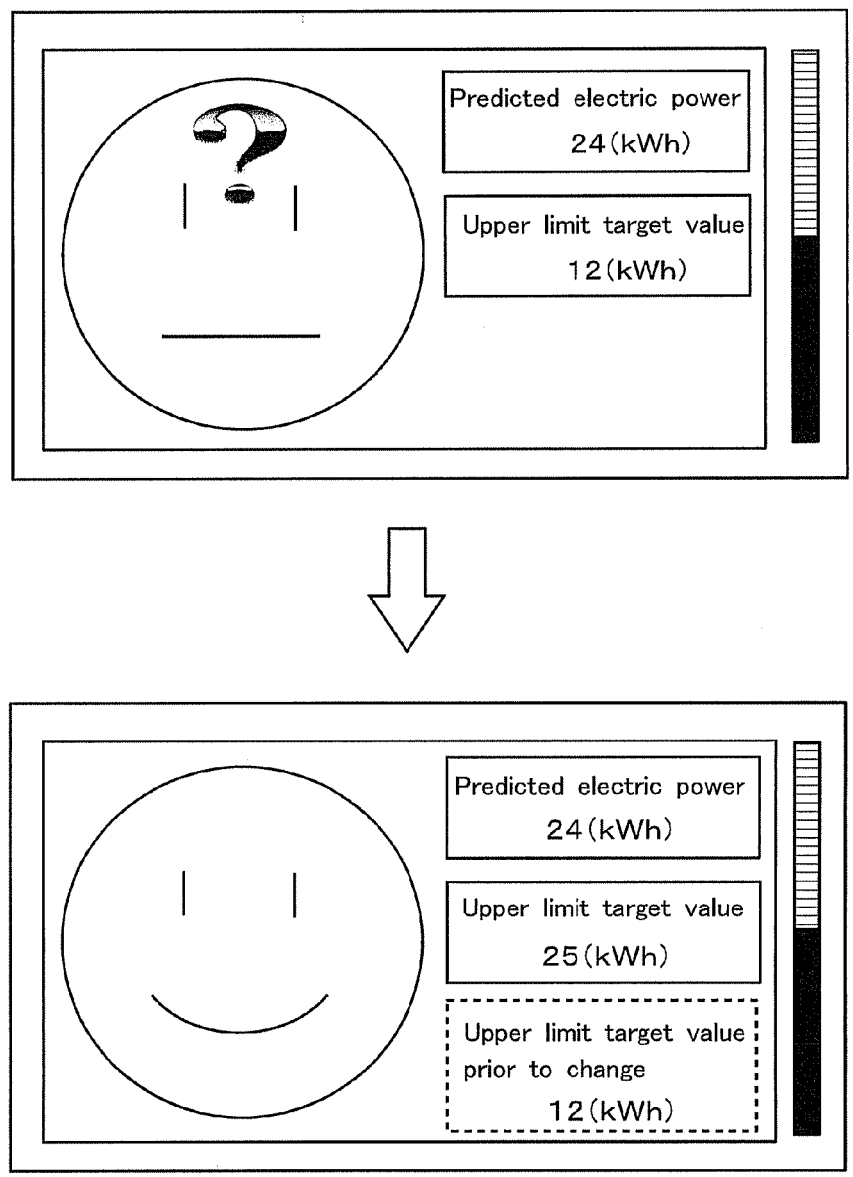
FIG. 13 is a diagram explicating an example of a display screen as it appears before and after instructions for changing the upper limit target value have been given.

An instruction for changing an upper limit target value within a relevant interval of time may be a signal that designates an appropriate upper limit target value or may be a trigger signal that computes an appropriate upper limit target value via the upper limit target value setup unit. When an appropriate upper limit target value is calculated via the first change instruction output unit, electric power predicted to be consumed during a relevant interval of time, a prescribed magnification of predicted electric power (e.g., 1.05 times), an average of an upper limit target value before and after a relevant interval of time, or an upper limit target value during the same interval of time obtained based on the previous achievement data may be a new upper limit target value. In case that the previous achievement data is used, it is preferable to use the data including the approximately the same type of information, such as highest temperature, minimum temperature, weather, and the like, including the same day of the week. FIG. 13 is a diagram explicating an example of a display screen as it appears before and after instructions for changing the upper limit target value have been given. FIG. 13 shows an example whereby the upper limit target value during such interval of time is inappropriate compared with the predicted power consumption. Thus, such upper limit target value during such interval of time has been changed to an appropriate value. Moreover, after the upper limit target value has been changed, it is also possible to indicate both the value before the change of the upper limit target value and the value thereafter on a display for a certain period.

Configuration is also possible such that users can establish an upper limit target value to be changed in advance. For example, in case that users cannot predict how much electric power will be consumed during a predetermined interval of time on a given day, users can establish a plurality of candidates for upper limit target values. In case that the lowest upper limit target value candidate is not appropriate compared with the predicted electric power computed during a given interval of time, an appropriate upper limit target value can be selected from among a plurality of upper limit target value candidates. Moreover, when a setting change for an upper limit target value has been accepted via the upper limit target value setup unit, the information on the upper limit target value before the setting change is also maintained. In case that an upper limit target value after the setting change is deemed to be inappropriate compared with the electric power predicted to be consumed during a given interval of time (i.e., in case that the electric power exceeds the set upper limit target value determined at approximately the point in time at which a predetermined interval of time commences), the processing for automatically returning such value to the upper limit target value prior to the setting change is also possible. As described above, it is also preferable for the first change instruction output unit to be configured to maintain extra upper limit target values in advance.

Specific Configuration of Third Embodiment

The specific configuration of the alarm output device of the third embodiment is the same as that of the alarm output device of the first embodiment explained in FIG. 6. The CPU stores an upper limit target value for power consumption for each regular interval of time inputted from the input device in the nonvolatile memory, and loads such value into the RAM as needed. Data transmitted from a measuring instrument for power consumption is received via the communication device. Based on such data, power consumption from the commencement time until the current time of a relevant interval of time and the predicted value of power consumption until the time at which such interval is completed are computed, and the results of computation are stored in the RAM. Comparing the upper limit target value for power consumption of a relevant interval of time that has been loaded into the RAM with the predicted value of power consumption until the time at which such interval is completed computed above, processing is performed to determine whether or not the predicted power consumption exceeds the upper limit target value. The resultants of such processing are stored in the RAM. Additionally, an interval of time between the time of commencement and the current time during a relevant interval of time is computed and the computation resultant is stored in a RAM. In case it is determined that the predicted electric power to be consumed within the aforementioned interval of time exceeds the upper limit target value (or is equal to or greater than a certain level or equal to or greater than a certain level), alarm data stored in the ROM is loaded into the RAM and an alarm is outputted to the display and the speaker. Moreover, in case that the electric power predicted to be consumed during a given interval of time exceeds an upper limit target value (or is equal to or greater than a certain level), if an interval of time between the time of commencement and the current time during a relevant interval of time falls under a certain value, the previous demand target value, which is based on similar conditions regarding dates, days of the week, and weather conditions, is loaded from a nonvolatile memory into a RAM. Such value can be established as a new demand target value during such interval of time.

Processing Flow of Third Embodiment

Figure 14:
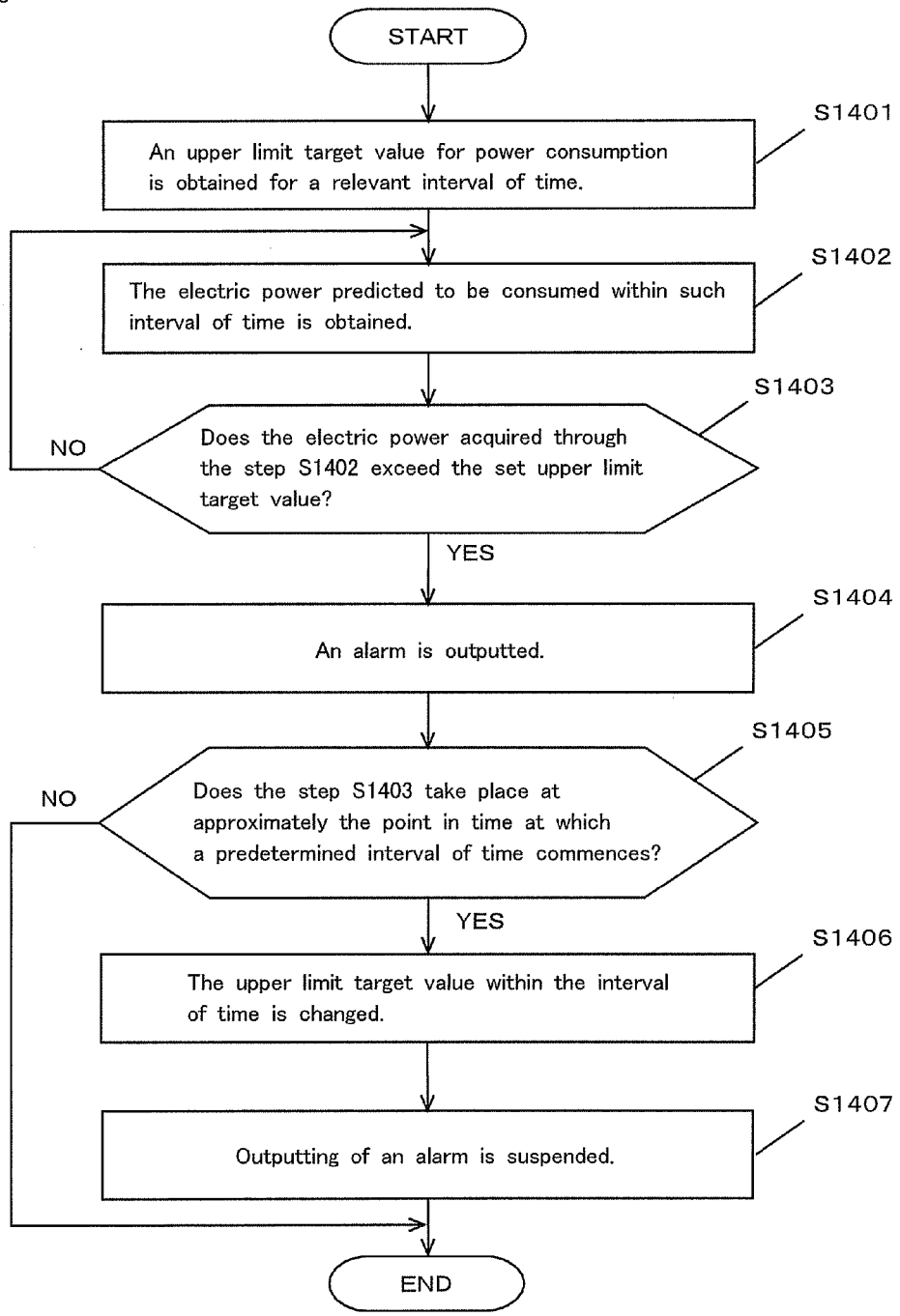
FIG. 14 is a diagram showing an example of the progression of the process of the alarm output method of the third embodiment.

FIG. 14 is a diagram showing an example of the progression of the process of the alarm output method of the third embodiment. The processing flow of FIG. 14 comprises the following steps. Initially, an upper limit target value for power consumption is obtained for a relevant interval of time (upper limit target value step; S1401). Next, the predicted electric power to be consumed within such interval of time is obtained (power consumption acquisition step; S1402). Subsequently, the electric power expected to be consumed within a relevant interval of time is obtained (power consumption acquisition step; S1403). Thereafter, it is determined whether or not the electric power acquired through the power consumption acquisition step exceed the set upper limit target value (determination step). When it is determined that the electric power exceeds the set upper limit target value, the processing moves on to the step 1404. When it is determined that the electric power does not exceed the set upper limit target value, the processing returns to the step 1402. An alarm that urges setting change is outputted (alarm output step; S1404). It is determined whether or not the determination step (S1403) takes place at approximately the point in time at which a predetermined interval of time commences (S1405). When it is determined that the determination step takes place at approximately the point in time at which a predetermined interval of time commences, the processing moves on to the step S1406. When it is determined that the determination step does not take place at approximately the point in time at which a predetermined interval of time commences, the processing is completed. An alarm that urges setting change is outputted (alarm output step; S0705). The upper limit target value within the interval of time is changed (first change instruction output unit; S1406). Next, outputting of an alarm is suspended (S1407). In addition, the time at which outputting of an alarm is suspended may be earlier than that of the step 1406.

Figure 15:
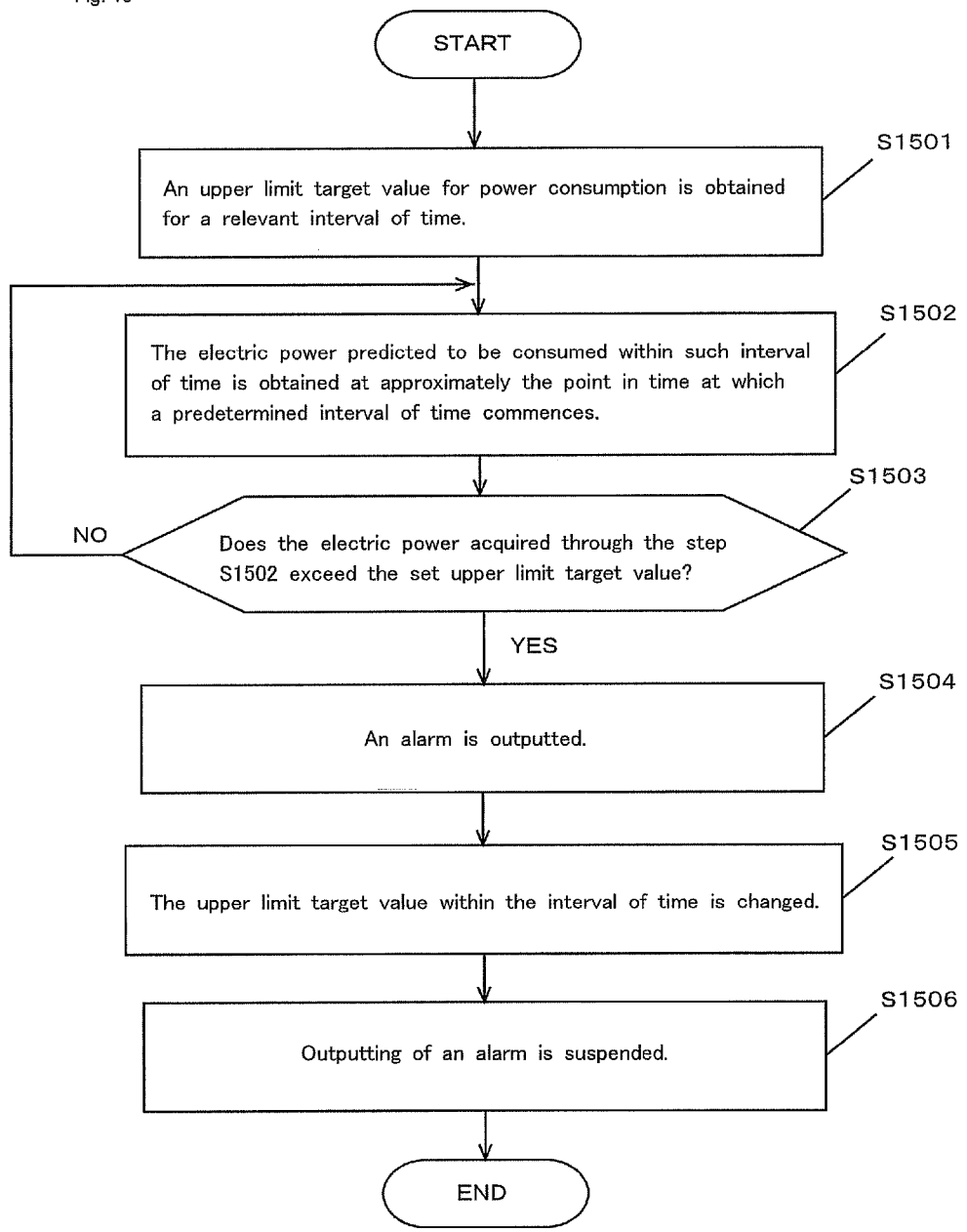
FIG. 15 is a diagram showing another example of the progression of the process of the alarm output method of the third embodiment.

FIG. 15 is a diagram showing another example of the progression of the process of the alarm output method of the third embodiment. The processing flow of FIG. 15 comprises the following steps. Initially, an upper limit target value for power consumption is obtained for a relevant interval of time (upper limit target value step; S1501). Next, the predicted electric power to be consumed within such interval of time is obtained (power consumption acquisition step; S1502). Subsequently, it is determined whether or not the electric power acquired through the power consumption acquisition step exceed the set upper limit target value (determination step). When it is determined that the electric power exceeds the set upper limit target value, the processing moves on to the step 1504. The upper limit target value within the interval of time is changed (first upper limit target value change step; S1504). Next, outputting of an alarm is suspended (S1505). In addition, the time at which outputting of an alarm is suspended may be earlier than that of the step 1504.

Brief Description of Effects of Third Embodiment

According to the alarm output device and the like of the third embodiment, even if an excessively low value has been established as an upper limit target value for power consumption, the upper limit target value is automatically changed while or after an alarm is outputted. Therefore, it is also possible to omit time and effort expended by users for setting changes.

Fourth Embodiment

Outline

An alarm output device of a fourth embodiment is characterized in that it determines at all times whether or not electric power expected to be consumed within a predetermined interval of time exceed the set upper limit target value and outputs instructions for changing the set upper limit target value within such interval during or following which an alarm is outputted, in case that the electric power exceeds the set upper limit target value, if the upper limit target value for the interval of time is equal to or less than the amount of standby electric power.

Configuration of Fourth Embodiment

Figure 16:
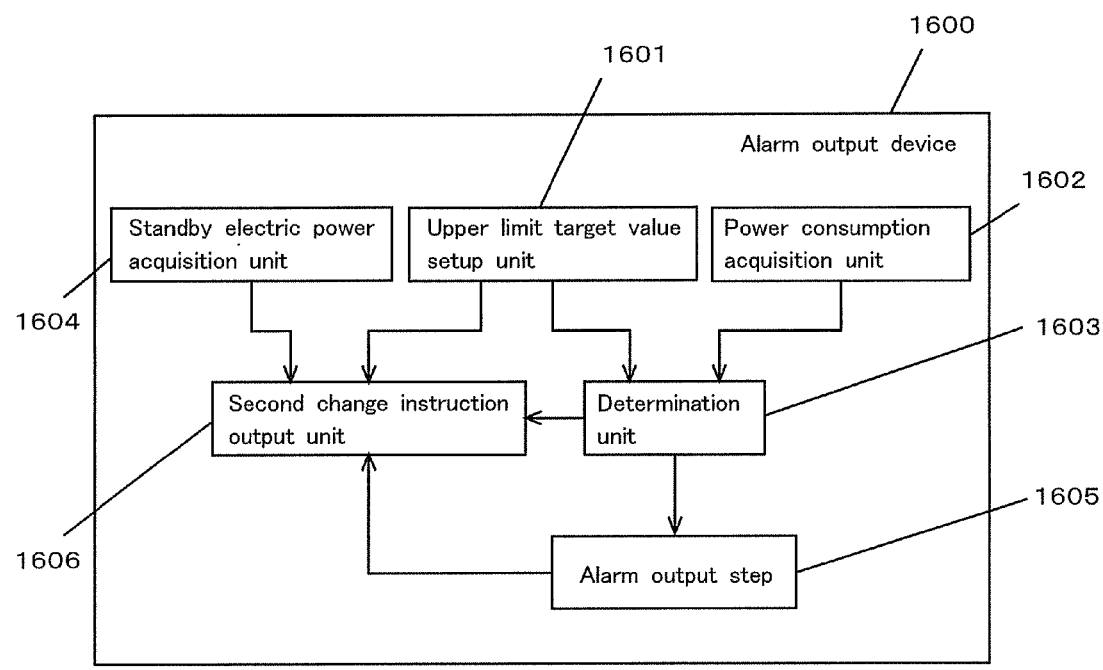
FIG. 16 is a diagram explicating an example of a functional block for an alarm output device of a fourth embodiment.

FIG. 16 is a diagram explicating an example of a functional block for an alarm output device of a fourth embodiment. As illustrated in FIG. 16, the "alarm output device" (1600) of the fourth embodiment comprises an "upper limit target value setup unit" (1601), a "power consumption acquisition unit" (1602), a "determination unit" (1603), an "alarm output unit" (1604), and a "change instruction output unit" (1605). Explanations of the second change instruction output unit, which are not included in the first to third embodiments, are explained hereinafter.

Figure 17:
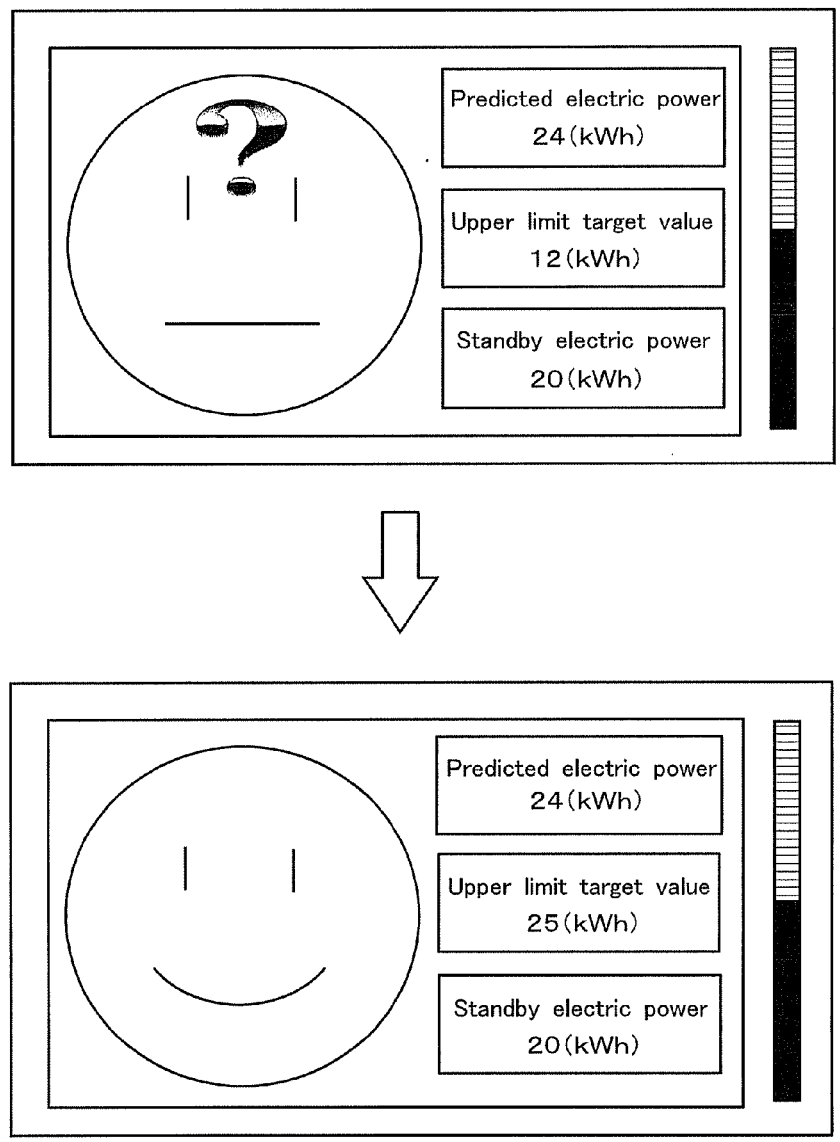
FIG. 17 is a diagram explicating an example of a display screen as it appears before and after instructions for changing the upper limit target value have been given.

The "second change instruction output unit" has a function for outputting instructions to the upper limit target value setup unit for changing the set upper limit target value within a predetermined interval during or following which an alarm is outputted, in case that the electric power exceeds the set upper limit target value determined by the determination unit, if the upper limit target value for the predetermined interval of time is equal to or less than the amount of standby electric power obtained through the standby electric power acquisition unit. An instruction for changing an upper limit target value within a relevant interval of time may be a signal that designates an appropriate upper limit target value or may be a trigger signal that computes an appropriate upper limit target value via the upper limit target value setup unit. In case that the previous achievement data is used, it is preferable to use the data including the approximately the same type of information, such as highest temperature, minimum temperature, weather, and the like, including the same day of the week. FIG. 17 is a diagram explicating an example of a display screen as it appears before and after instructions for changing the upper limit target value have been given. FIG. 17 shows an example whereby the upper limit target value during such interval of time is inappropriate compared with the predicted power consumption. Thus, such upper limit target value during such interval of time has been changed to an appropriate value. Moreover, after the upper limit target value has been changed, it is also possible to indicate both the value before the change of the upper limit target value and the value thereafter on a display for a certain period.

Specific Configuration of Fourth Embodiment

The specific configuration of the alarm output device of the fourth embodiment is the same as that of the alarm output device of the first embodiment explained in FIG. 6. The CPU stores an upper limit target value for power consumption for each regular interval of time inputted from the input device in the nonvolatile memory, and loads such value into the RAM as needed. Data transmitted from a measuring instrument for power consumption is received via the communication device. Based on such data, power consumption from the commencement time until the current time of a relevant interval of time and the predicted value of power consumption until the time at which such interval is completed are computed, and the results of computation are stored in the RAM. Predicted standby electric power values at relevant intervals of time inputted from the input device are stored in nonvolatile memory, and such values are loaded into a RAM as needed. Comparing the upper limit target value for power consumption of a relevant interval of time that has been loaded into the RAM with the predicted value of power consumption until the time at which such interval is completed computed above, processing is performed to determine whether or not the predicted power consumption exceeds the upper limit target value. The resultants of such processing are stored in the RAM. In case it is determined that the predicted electric power to be consumed within the aforementioned interval of time exceeds the upper limit target value, alarm data stored in the ROM is loaded into the RAM and an alarm is outputted to the display and the speaker. The processing for determining whether or not an upper limit target value for a relevant interval of time exceeds the predicted standby electric power for such interval of time takes place, and the results of processing are stored in a RAM. Moreover, in case that the electric power predicted to be consumed during a given interval of time exceeds an upper limit target value, if the upper limit target value for a relevant interval of time is equal to or less than the predicted standby electric power, the previous demand target value, which is based on similar conditions regarding dates, days of the week, and weather conditions, is loaded from a nonvolatile memory into a RAM. Such value can be established as a new demand target value during such interval of time.

Processing Flow of Fourth Embodiment

Figure 18:
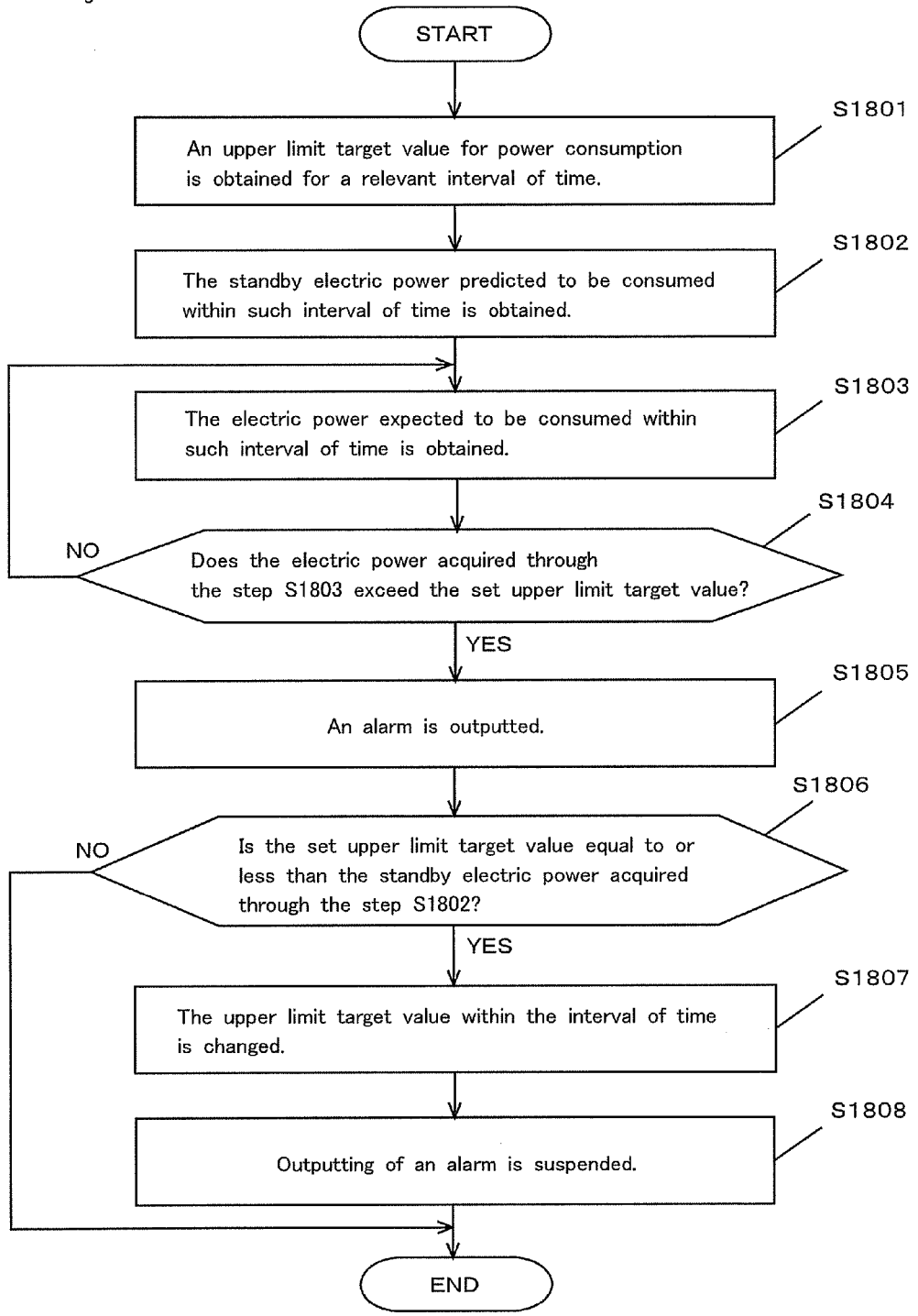
FIG. 18 is a diagram showing an example of the progression of the process of the alarm output method of the fourth embodiment.

FIG. 18 is a diagram showing an example of the progression of the process of the alarm output method of the fourth embodiment. The processing flow of FIG. 15 comprises the following steps. Initially, an upper limit target value for power consumption is obtained for a relevant interval of time (upper limit target value step; S1801). Next, the predicted standby electric power to be consumed within such interval of time is obtained (standby electric power acquisition step; S1802). Subsequently, the electric power expected to be consumed within a relevant interval of time is obtained (power consumption acquisition step; S1803). Thereafter, it is determined whether or not the electric power acquired through the power consumption acquisition step exceed the set upper limit target value (determination step; S1804). When it is determined that the electric power exceeds the set upper limit target value, the processing moves on to the step 1805. When it is determined that the electric power does not exceed the set upper limit target value, the processing returns to the step 1803. An alarm is outputted (alarm output step; S1805). Next, it is determined whether or not the upper limit target value for a predetermined interval of time is equal to or less than the amount of standby electric power obtained through the standby electric power acquisition unit (second upper limit target value change step). When it is determined that the upper limit target value for a predetermined interval of time is equal to or less than the amount of standby electric power, the processing moves on to the step 1807. When it is determined that the upper limit target value for a predetermined interval of time is not equal to or less than the amount of standby electric power, the processing is completed. The upper limit target value within the interval of time is changed (second upper limit target value change step; S1807). Next, outputting of an alarm is suspended (S1808). In addition, the time at which outputting of an alarm is suspended may be earlier than that of the step 1807.

Brief Description of Effects of Fourth Embodiment

According to the alarm output device and the like of the fourth embodiment, even if an excessively low value has been established as an upper limit target value for power consumption, the upper limit target value is automatically changed while or after an alarm is outputted. Therefore, it is also possible to omit time and effort expended by users for setting changes.

What is claimed is:

1. An alarm output device comprising:
an upper limit target value setup unit that is configured to establish an upper limit target value for power consumption of a monitored device for each of a plurality of time intervals including a first interval, the first interval having a start time and an end time;
a power consumption acquisition unit that is configured to obtain expected electric power consumption expected to be consumed by the monitored device within an entire period of the first interval based on actual electric power consumption actually consumed by the monitored device between the start time and a current time;
a determination unit that is configured to continuously determine whether or not the expected electric power consumption acquired through the power consumption acquisition unit exceeds the upper limit target value; and
an alarm output unit that is configured to output an alarm, wherein
the alarm output unit outputs the alarm when:
the expected electric power consumption exceeds the upper limit target value; and
an elapsed time between the start time and the current time is within a predetermined amount of time.

2. The alarm output device according to claim 1, wherein the predetermined amount of time is equal to or less than 10% of the entire period of the first interval.

3. An alarm output device comprising:
an upper limit target value setup unit that is configured to establish an upper limit target value for power consumption of a monitored device for each of a plurality of time intervals including a first interval, the first interval having a start time and an end time;
a power consumption acquisition unit that is configured to obtain expected electric power consumption expected to be consumed by the monitored device within an entire period of the first interval based on actual electric power consumption actually consumed by the monitored device between the start time and a current time;
a standby electric power acquisition unit that is configured to obtain standby electric power consumption expected to be consumed within the entire period of the first interval;
a determination unit that is configured to continuously determine whether or not the expected electric power consumption acquired through the power consumption acquisition unit exceeds the upper limit target value; and
an alarm output unit that is configured to output an alarm, wherein
the alarm output unit outputs the alarm when:
the expected electric power consumption exceeds the upper limit target value; and
the upper limit target value is equal to or less than the standby electric power consumption.

4. An alarm output method comprising:
establishing an upper limit target value for power consumption of a monitored device for each of a plurality of time intervals including a first interval, the first interval having a start time and an end time;
obtaining through a power consumption acquisition unit expected electric power consumption expected to be consumed by the monitored device within an entire period of the first interval based on actual electric power consumption actually consumed by the monitored device between the start time and a current time;
continuously determining whether or not the expected electric power consumption acquired through the power consumption acquisition unit exceeds the upper limit target value; and
outputting an alarm, wherein
the alarm is output when:
the expected electric power consumption exceeds the upper limit target value; and
an elapsed time between the start time and the current time is within a predetermined amount of time.

5. The alarm output method according to claim 4, wherein the predetermined amount of time is equal to or less than 10% of the entire period of the first interval.

6. An alarm output method comprising:
   establishing an upper limit target value for power consumption of a monitored device for each of a plurality of time intervals including a first interval, the first interval having a start time and an end time;
   obtaining through a power consumption acquisition unit expected electric power consumption expected to be consumed by the monitored device within an entire period of the first interval based on actual electric power consumption actually consumed by the monitored device between the start time and a current time;
obtaining standby electric power consumption expected to be consumed by the monitored device within the entire period of the first interval;
   continuously determining whether or not the expected electric power consumption acquired through the power consumption acquisition unit exceeds the upper limit target value; and
   outputting an alarm, wherein
the alarm is output when:
   the expected electric power consumption exceeds the upper limit target value; and
   the upper limit target value is equal to or less than the standby electric power consumption.

* * * * *